United States Patent
Notthoff

(10) Patent No.: US 7,129,780 B2
(45) Date of Patent: Oct. 31, 2006

(54) COMPOUND LOAD FOR DIFFERENTIAL CIRCUITS

(75) Inventor: Johannes K Notthoff, Vista, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 10/765,759

(22) Filed: Jan. 27, 2004

(65) Prior Publication Data

US 2005/0162229 A1    Jul. 28, 2005

(51) Int. Cl.
H03F 3/45    (2006.01)
(52) U.S. Cl. .................................... 330/252
(58) Field of Classification Search .............. 330/69, 330/252, 254, 298, 311
See application file for complete search history.

(56) References Cited

U.S. PATENT DOCUMENTS

| 6,194,972 | B1* | 2/2001 | Brown | 331/108 B |
| 6,683,498 | B1* | 1/2004 | Burns et al. | 330/261 |
| 2005/0062533 | A1* | 3/2005 | Vice | 330/252 |

* cited by examiner

Primary Examiner—Steven J. Mottola
(74) Attorney, Agent, or Firm—Carmen B. Patti & Assoc., LLC

(57) ABSTRACT

An improved load configuration is provided for differential circuits which increases circuit bandwidth without increasing power dissipation. A differential circuit generally includes a differential pair of transistors having emitters coupled together. The improved load configuration is comprised of a load resistor coupled to the collector of each transistor and an inductor coupled in series with each of the load resistors, such that the inductors are coupled to each other by mutual inductance.

13 Claims, 4 Drawing Sheets

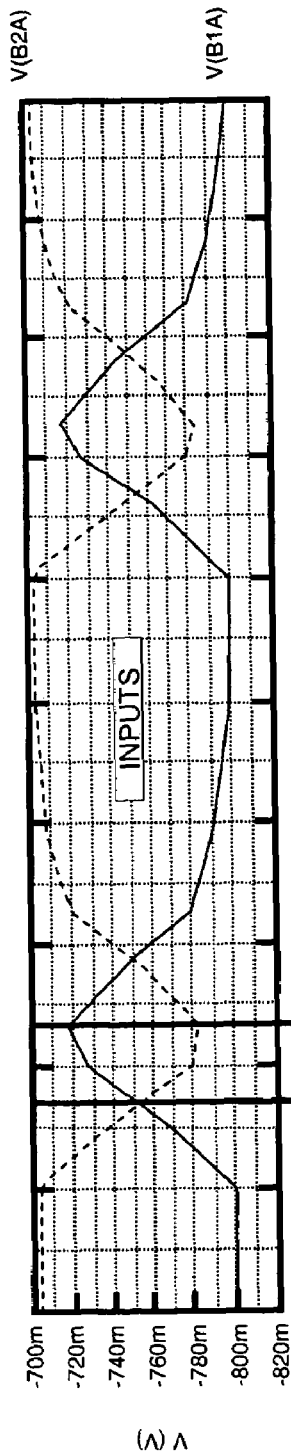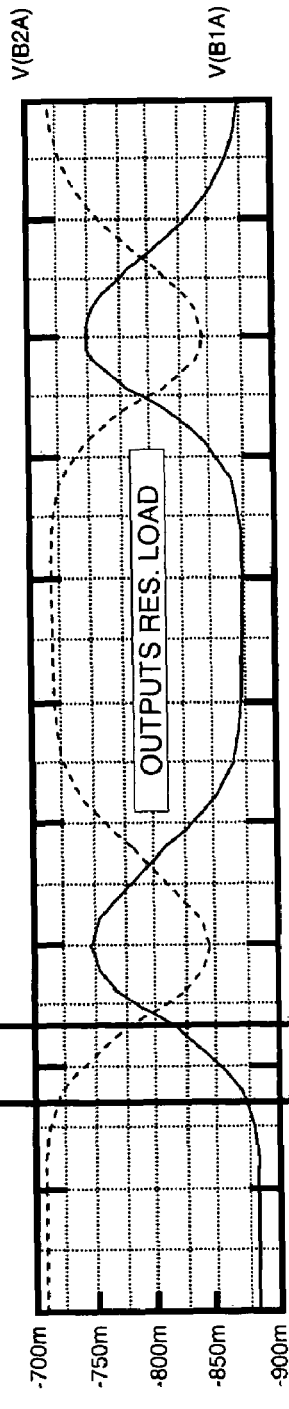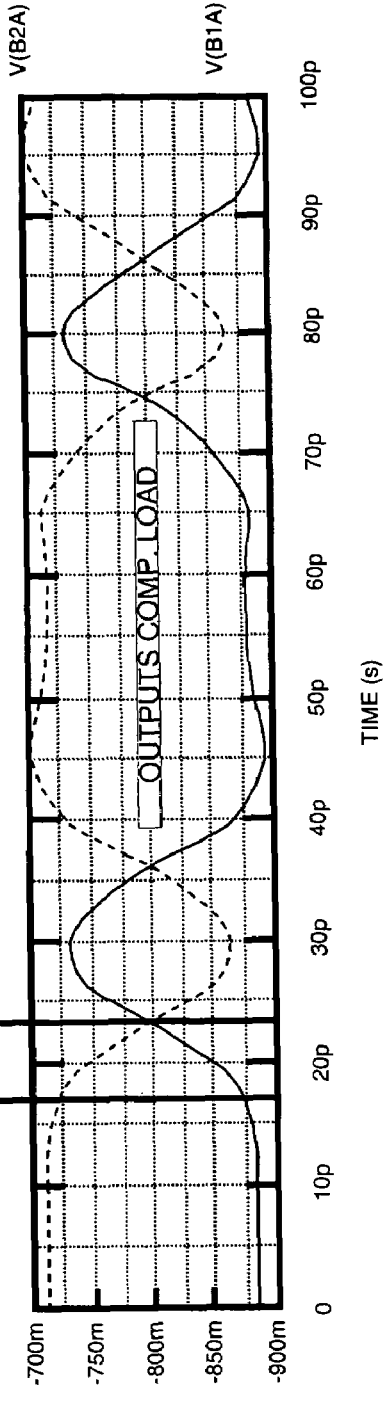

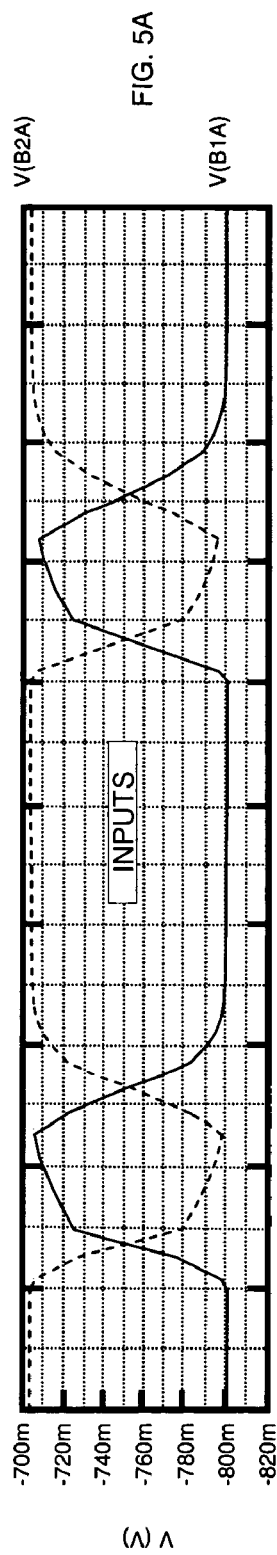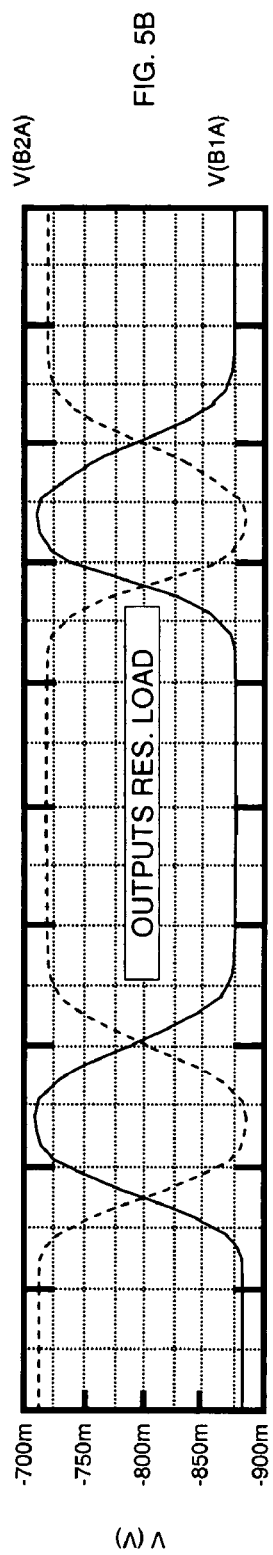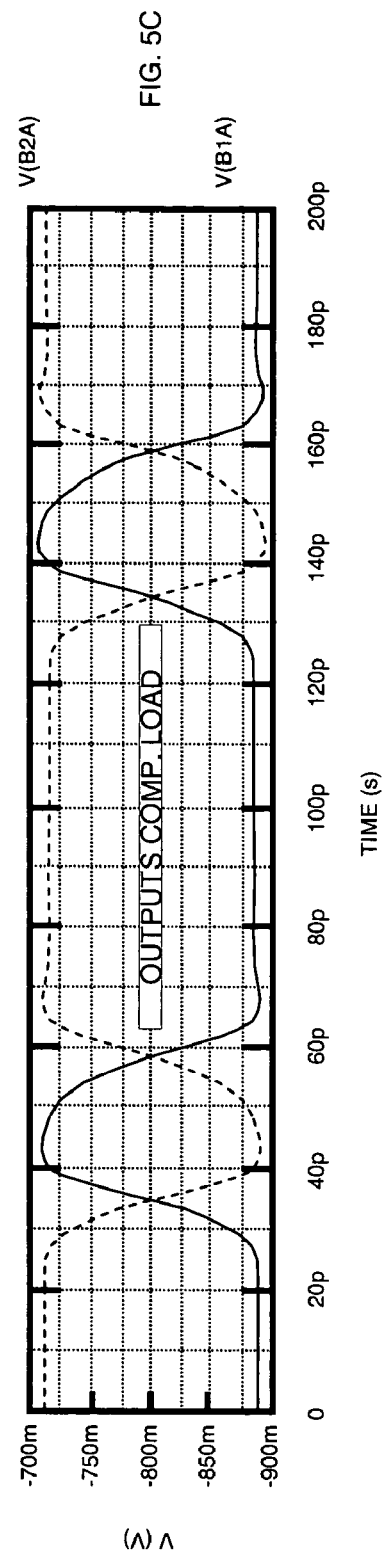

COMPOUND LOAD FOR DIFFERENTIAL CIRCUITS

FIELD OF THE INVENTION

The present invention relates generally to differential circuits and, more particularly, to an improved load configuration for differential circuits which increases circuit bandwidth without increasing power dissipation.

BACKGROUND OF THE INVENTION

Differential linear amplifier and switching circuits are commonly used in electronic systems. FIG. 1 illustrates an exemplary differential circuit. The differential circuit includes a pair of transistors having the emitters connected to a common current source and the collectors connected to load resistors which are in turn tied to a voltage supply. In operation, a differential signal of opposite polarity may be applied to the bases of the transistors, thereby resulting in an amplified signal appearing at the collectors of the transistors. The bandwidth of the circuit is commonly defined as the frequency where the output amplitude drops by −3 dB. However, bandwidth is affected by a number of parameters, including the forward transit time of the transistors, junction and parasitic capacitances associated with the transistors, load resistance, inductance in the metal interconnect, etc.

For high speed applications, the collector time constant is a significant limitation on bandwidth. Collector capacitance acts as a shunt in parallel to the load resistor, thereby gradually reducing the output amplitude with increasing frequency. The pole set by the collector node can be moved out in frequency by reducing the collector load resistance and increasing the operating current. However, there are limits to these measures. Temperature rise causes transistor parameters to deteriorate as well as higher power dissipation.

Therefore, it is desirable to provide an improved load configuration for differential circuits which increases circuit bandwidth without increasing power dissipation.

SUMMARY OF THE INVENTION

In accordance with the present invention, an improved load configuration is provided for differential circuits which increases circuit bandwidth without increasing power dissipation. A differential circuit generally includes a differential pair of transistors having emitters coupled together. The improved load configuration is comprised of a load resistor coupled to the collector of each transistor and an inductor coupled in series with each of the load resistors, such that the inductors are coupled to each other by mutual inductance.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

FIGS. 4A–4C are diagrams of waveforms illustrating improved transition times for differential pair circuits of the present invention in the context of a pulse switching application; and FIGS. 5A–5C are diagrams of waveforms illustrating improved transition times for differential pair circuits of the present invention in the context of another exemplary pulse switching application.

DETAILED DESCRIPTION OF THE PREFERRED EMBODIMENTS

Figure 2:
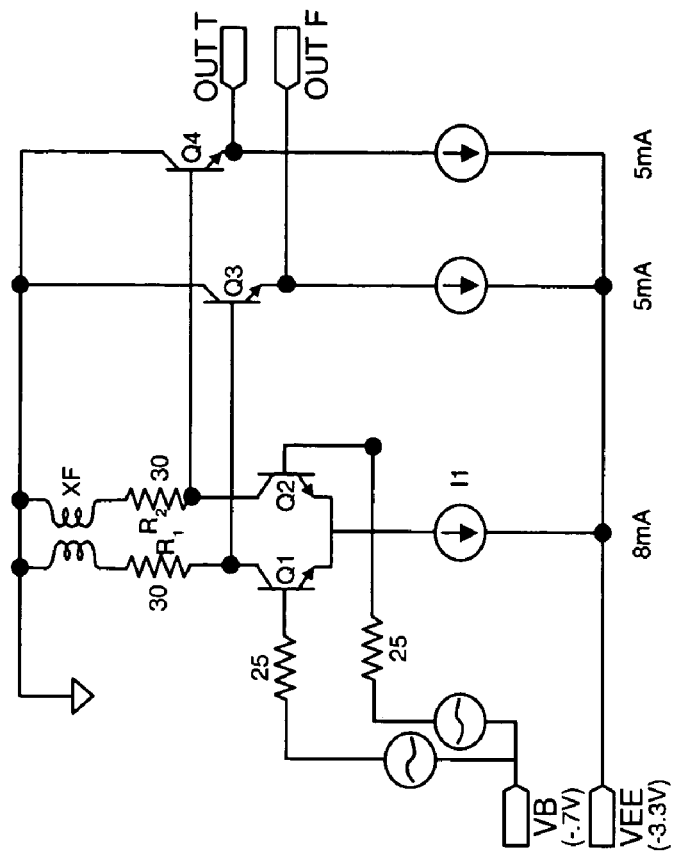
FIG. 2 is a schematic of an exemplary differential pair circuit having an improved compound load configuration in accordance with the present invention.
Figure 1:
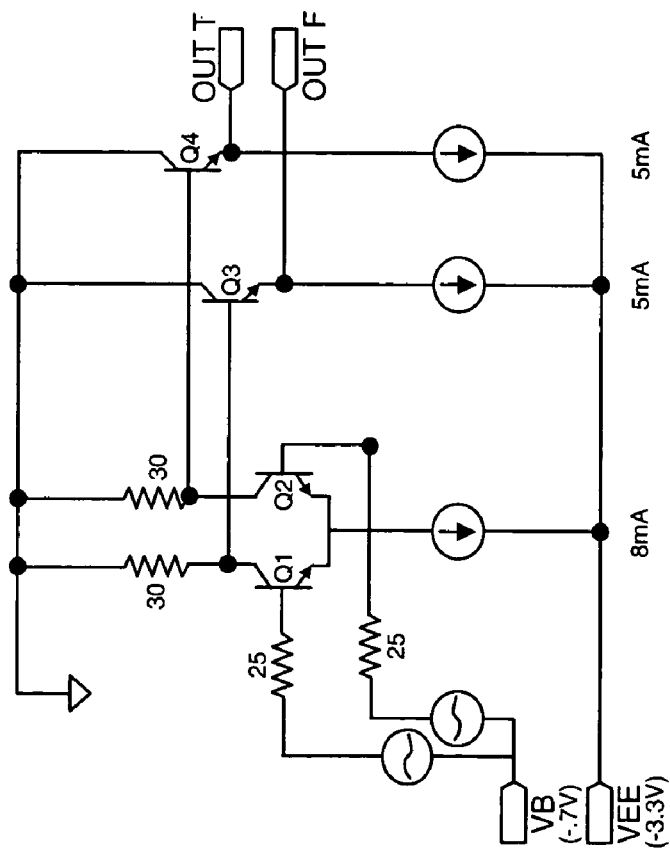
FIG. 1 is a schematic of an exemplary differential pair circuit having a conventional resistive load configuration.

FIG. 2 is a schematic of an exemplary differential pair circuit 10 having an improved compound load configuration in accordance with the present invention. The differential pair circuit 10 is generally comprised of a pair of transistors Q1, Q2 having emitters coupled together as is well known in the art. More specifically, the emitters of the transistors are connected to a common current source I1, and the collectors of the transistors are connected via resistive load elements R1, R2 to a voltage supply. Heterojunction bipolar transistors are used in the exemplary embodiment. However, it is readily understood that other types of transistors devices, such as field-effect transistors, are also within the scope of the present invention. Moreover, while the following description is provided with reference to a particular differential pair circuit configuration, it is readily understood that the present invention is applicable to other differential pair circuit configurations.

In operation, a differential signal of opposite polarity is applied to bases of the transistors. Accordingly, an amplified differential signal appears at the collectors of the transistors. To reduce loading of the collectors nodes, the differential pair circuit 10 is preferably followed by a buffer stage. In the exemplary embodiment, a well known emitter follower configuration is employed as the buffer stage, such that the signal at the emitter nodes of each transistor Q3, Q4 serves as output for the differential pair circuit 10.

Circuit bandwidth will increase if the impedance of the load resistor in parallel with the collector capacitance can be maintained beyond the normal roll-off point. This is typically accomplished by placing an inductor in series with the load resistor. Self-inductance of the inductor is generally chosen to add to the impedance at the point where the output response starts to fall off, thereby extending the bandwidth. Another consideration is to match the reactance to the capacitance to form a parallel-resonant circuit with the resonant frequency set at about the normal −3 dB point of the resistive load circuit. This technique is known as inductive peaking.

In accordance with the present invention, an improved load configuration is provided for the differential circuit 10 which increases circuit bandwidth without increasing power dissipation. The improved load configuration includes load resistors R1, R2 that are placed in series with two inductors L1, L2 which are coupled to each other by mutual inductance, thereby forming a transformer XF. Specifically, the windings of the inductors are connected out-of-phase to the load resistors R1, R2. As a result, the transformer XF and associated capacitances form a highly damped dual parallel-resonant circuit.

In the exemplary embodiment, the transformer XF is implemented with standard metallization. For instance, the transformer may be constructed from a first strip of metal that is broadside coupled to another strip of metal. It is envisioned that the first strip of metal may be air bridged to decrease parasitic capacitance; instead of an air bridge, a low-k dielectric would provide similar results. In another instance, the transformer may be constructed from two strips of metal placed side-by-side. In either instance, the physical dimensions are on the order of 20 to 100 um for an operating range of about 20 to 50 GHz, and thus does not significantly impact circuit layout. For a lower frequency range, the length of the transformer windings are correspondingly longer. For short lengths the windings can be a straight trace of metal, for longer lengths the trace can be folded or coiled to reduce required layout area.

This improved load configuration offers several important advantages over the conventional separated inductor configuration. First, the benefits of mutual inductance allows the inductance of each winding to be reduced by a proportional amount, thereby resulting in a more compact on-chip layout. Second, fall time at the collector nodes of the transistors is typically smaller than the rise time at the collector nodes in a conventional inductor configuration. However, by coupling the inverted falling edge waveform to the other rising edge node, rise time and fall times are equalized in the coupled inductor configuration of the present invention. This feature is very beneficial to switching applications.

Figure 3A:
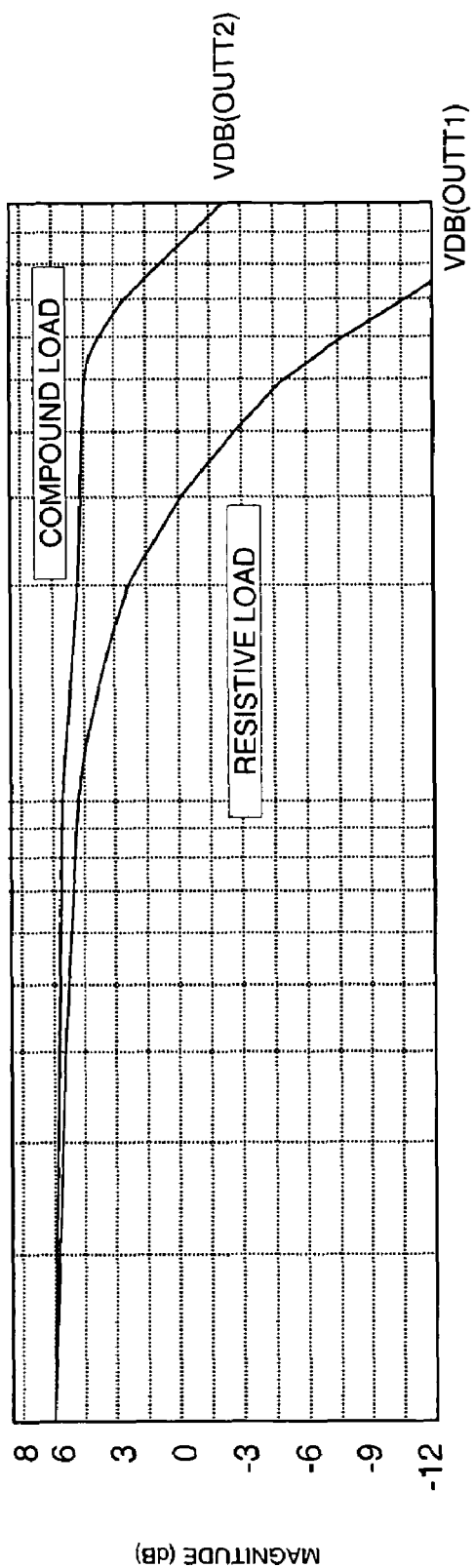
FIGS. 3A and 3B are diagrams of waveforms comparing the small-signal response of a different pair circuit having a conventional resistive load configuration with a differential pair circuit having the improved load configuration of the present invention, respectively.
Figure 3B:
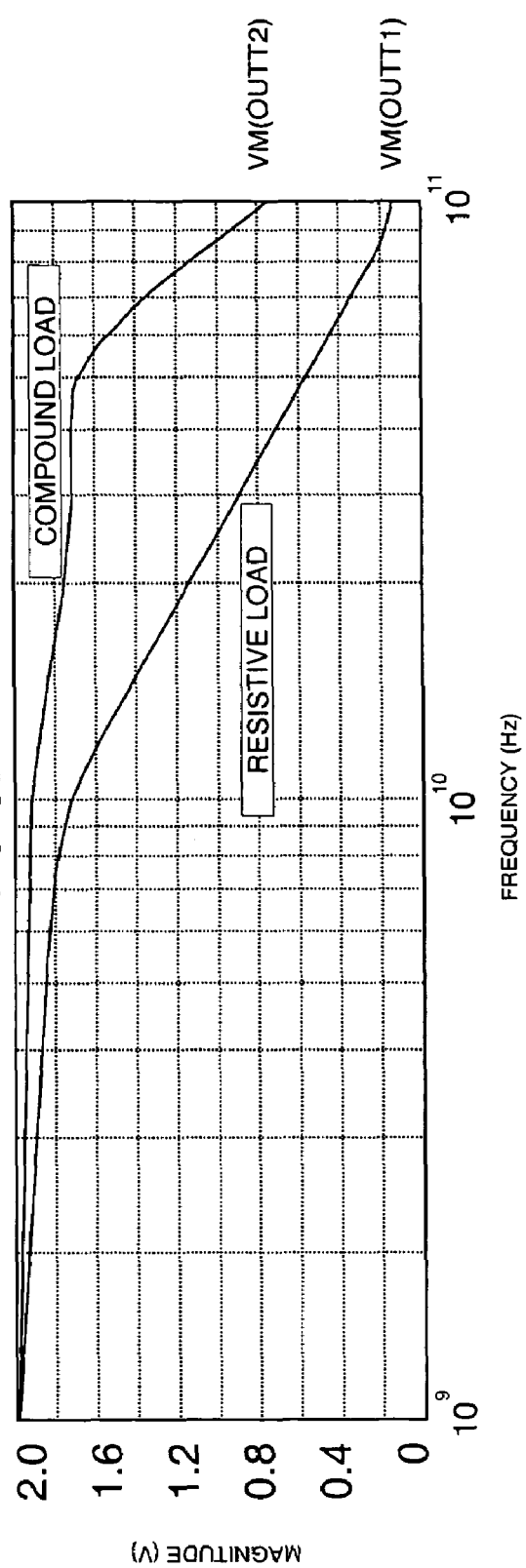

Computer simulations demonstrate some of the benefits of the present invention. FIGS. 3A and 3B provide waveforms which compare the small-signal response of a different pair circuit having a conventional resistive load configuration with a differential pair circuit having the improved load configuration of the present invention. As shown, the −3 db bandwidth of the circuit having the conventional resistive load configuration is about 16 GHz; whereas, the circuit having the improved load configuration exhibits a bandwidth of about 68 Ghz. In this example, the transformer of the improved load configuration had a self-inductance per winding of 120 pH.

FIGS. 4A–4C are diagrams of waveforms illustrating improved transition times for differential pair circuits of the present invention in the context of a pulse switching application. In this example, a 12.5 ns wide pulse is applied to both a differential pair circuit having a conventional resistive load configuration and a differential pair circuit having the improved load configuration of the present invention. The input signal being shown in FIG. 4A. The differential logic swing is about 90 mV for the circuit having a conventional resistive load configuration as shown in FIG. 4B, but is on the order of 145 mV for the circuit having the improved load configuration as shown in FIG. 4C. Thus, the propagation delay is about 25% less for the circuit having the improved load configuration.

FIGS. 5A–5C provide waveforms illustrating another example. In this example, the input pulse width is increased to 25 ps as shown in FIG. 5A. As a result, the transition times are much better for the circuit having the improved load configuration. The transition time for circuit having the conventional load configuration is 9 ps for a 100 mV differential signal; whereas, the transition time for the circuit having the improved load configuration is 6 ps. This is important for high speed data processing where fast transition times give improved data waveforms, with steeper transition edges. These two examples employed a transformer with 60 pH of self-inductance which was chosen to limit the overshoot and undershoot to 10% of the amplitude.

The transformer contribution to the output signal could be increased by increasing the inductance at the expense of a larger over/undershoot and following ringing. The proper choice of the transformer inductance becomes a tradeoff between the two. When the junction and fixed parasitic capacitances are known and properly modeled, the best tradeoff is easily determined with a good circuit analysis program. The optimum choice of the transformer inductances will be different for constant frequency application (or clock) versus pulse or data applications.

While these exemplary embodiments of differential circuits have been described above with specific components having specific values and arranged in a specific configuration, it will be appreciated that these circuits may be constructed with many different configurations, components, and/or values as necessary or desired for a particular application. The above configurations, components and values are presented only to describe one particular embodiment that has proven effective and should be viewed as illustrating, rather than limiting, the present invention. Thus, the description of the invention is merely exemplary in nature and, thus, variations that do not depart from the gist of the invention are intended to be within the scope of the invention. Such variations are not to be regarded as a departure from the spirit and scope of the invention.

What is claimed is:

1. A differential transistor pair circuit having first and second resistive load elements coupled to collectors thereof, the improvement comprising:
    an inductor coupled in series with each of the resistive load elements, such that the inductors are coupled to each other by mutual inductance to form a transformer having windings connected out of phase with said resistive load elements;
    such that an inverted falling edge waveform at a node associated with the first resistive load element is coupled to a rising edge waveform at a node associated with the second resistive load element, substantially equalizing waveform rise and fall times.

2. The differential transistor pair circuit of claim 1 where the inductors are coupled out-of-phase to the collectors of the transistors.

3. A differential circuit having a compound load, comprising:
    a differential pair of transistors having emitters coupled together; a resistive load element coupled to a collector of each transistor to form first and second resistive load elements; and an inductor coupled in series with each of the load resistors, where the inductors are magnetically coupled together to form a transformer having windings connected out of phase with said resistive load elements; such that an inverted falling edge waveform at a node associated with the first resistive load element is coupled to a rising edge waveform at a node associated with the second resistive load element, substantially equalizing waveform rise and fall times.

4. The differential circuit of claim 3 wherein the inductors are coupled out-of-phase to the collectors of the transistors.

5. The differential circuit of claim 3 further comprises a common current source connected to the emitters of the transistors.

6. The differential circuit of claim 3 wherein a differential signal of opposite polarity is applied to bases of the transistors.

7. The differential circuit of claim 3 further comprises a buffer stage operable to reduce loading of the collectors of the transistors.

8. A method for increasing bandwidth of a differential transistor pair circuit having first and second resistive load elements coupled to collectors thereof, comprising:

connecting an inductor in series with each of the resistive load elements to form a transformer having windings connected out of phase with said resistive load elements; and coupling an inverted falling edge waveform at a node associated with the first resistive load element to a rising edge waveform at a node associated with the second resistive load element to substantially equalize waveform rise and fall times.

9. A differential circuit having a compound load, comprising:

a differential pair of transistors having emitters coupled together;

a load resistor coupled to a collector of each transistor to form first and second load resistors; and a transformer having a pair of inductors coupled to each other by mutual inductance and each coupled in series with one of the load resistors to form a transformer having windings connected out of phase with said load resistors;

such that an inverted falling edge waveform at a node associated with the first load resistor is coupled to a rising edge waveform at a node associated with the second load resistor, substantially equalizing waveform rise and fall times.

10. The differential circuit of claim 9 wherein the inductors are coupled out-of-phase to the collectors of the transistors.

11. The differential circuit of claim 9 further comprises a common current source connected to the emitters of the transistors.

12. The differential circuit of claim 9 wherein a differential signal of opposite polarity is applied to bases of the transistors.

13. The differential circuit of claim 9 further comprises a buffer stage operable to reduce loading of the collectors of the transistors.

* * * * *